United States Patent
Chou

(10) Patent No.: US 8,149,907 B2
(45) Date of Patent: Apr. 3, 2012

(54) ADAPTIVE EQUALIZATION APPARATUS WITH EQUALIZATION PARAMETER SETTING ADAPTIVELY ADJUSTED ACCORDING TO EDGES OF EQUALIZER OUTPUT MONITORED IN REAL-TIME MANNER AND RELATED METHOD THEREOF

(75) Inventor: Min-Chung Chou, Miaoli County (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 652 days.

(21) Appl. No.: 12/350,193

(22) Filed: Jan. 7, 2009

(65) Prior Publication Data
US 2010/0172400 A1    Jul. 8, 2010

(51) Int. Cl.
*H03H 7/40* (2006.01)
(52) U.S. Cl. ........................................ 375/232
(58) Field of Classification Search .................. 375/229, 375/230, 231, 232, 233, 234, 235, 236; 333/18, 333/28 R; 708/300, 322, 323; 379/340, 379/398
See application file for complete search history.

(56) References Cited

U.S. PATENT DOCUMENTS

| | | | |
|---|---|---|---|
| 7,286,597 B2 | 10/2007 | Buchwald | |
| 7,542,507 B2 * | 6/2009 | Sohn | 375/233 |
| 8,009,920 B2 * | 8/2011 | Tung et al. | 382/228 |
| 2008/0019435 A1 | 1/2008 | Chou | |

OTHER PUBLICATIONS

Gerfers, "A 0.2-2Gb/s 6x OSR Receiver Using a Digitally Self-Adaptive Equalizer," pp. 1436-1448, IEEE Journal of Solid-State Circuits, Vol. 43, No. 6, Jun. 2008.
Besten, "A 200Mb/s-2Gb/s Oversampling RX with Digitally Self-Adapting Equalizer in 0.18um CMOS Technology", 2006 Symposium on VLSI Circuits Digest of Technical Papers, 2006.

* cited by examiner

*Primary Examiner* — Sam K Ahn
(74) *Attorney, Agent, or Firm* — Winston Hsu; Scott Margo

(57) ABSTRACT

An adaptive equalization apparatus is provided. The adaptive equalization apparatus includes an equalizer, a monitor circuit, and a control circuit. The equalizer receives a first signal, and equalizes the first signal according to an equalization parameter setting to thereby generate a second signal. The monitor circuit is electrically connected to the equalizer, and monitors edges of the second signal in a real-time manner to thereby generate a detection result. The control logic is electrically connected to the equalizer, and adaptively adjusts the equalization parameter setting according to the detection result.

10 Claims, 8 Drawing Sheets

ADAPTIVE EQUALIZATION APPARATUS WITH EQUALIZATION PARAMETER SETTING ADAPTIVELY ADJUSTED ACCORDING TO EDGES OF EQUALIZER OUTPUT MONITORED IN REAL-TIME MANNER AND RELATED METHOD THEREOF

BACKGROUND

The present invention relates to equalizing an input signal, and more particularly, to an adaptive equalization apparatus with an equalization parameter setting adaptively adjusted according to edges of an equalizer output monitored in a real-time manner and related method thereof.

With regard one application using a cable (e.g., an HDMI cable) to interconnect a transmitter end and a receiver end, the cable length is not required to be a fixed value. In other words, one user might use a cable of a first length to interconnect the transmitter end and the receiver end, while the other user might use a cable of a second length to interconnect the transmitter end and the receiver end. In general, the cable will affect the transmitted signal in amplitude and/or phase. Therefore, in a case where the transmitter ends output the same signal to respective receiver ends, the received signals at the receiver ends are not identical to each other due to the fact that the cable characteristics, such as the cable lengths, are not the same. For example, the cable has a limited channel bandwidth, and the inter-symbol interference (ISI) might occur to degrade the signal quality of the transmitted signal. An adaptive equalizer is generally implemented at the receiver end to adaptively reduce or eliminate the signal degradation caused by the cable.

Please refer to FIG. 1 in conjunction with FIG. 2. FIG. 1 illustrates an eye diagram of a received signal degraded by jitter according to the related art. FIG. 2 illustrates an eye diagram of a received signal degraded by inter-symbol interference according to the related art. As known to those skilled in the art, the eye diagram is a useful tool for the qualitative analysis of the digital signal transmission. In general, the eye diagram is an oscilloscope display of a digital signal, repetitively sampled to get a good representation of its behavior. As shown in FIG. 1, the exemplary eye diagram E1 is constructed by an overlay of a plurality of signal sequences S1, S2, S3 on the screen of an oscilloscope. As one can see, the width between transitions in the signal sequences S1, S2, S3 is equal to the same value (i.e., W1=W2=W3=W4=W5=W6); however, the transition timings of the signal sequences S1, S2, S3 are different due to jitter. With regard to the other eye diagram E2 shown in FIG. 2, it is constructed by an overlay of a plurality of signal sequences S1', S2', S3' on the screen of an oscilloscope. As one can see, though the lengths of the signal sequences S1', S2', S3' are the same (i.e., W1'+W2'=W3'+W4'=W5'+W6'), the width between transitions in the signal sequences S1, S2, S3 varies due to inter-symbol interference (i.e., W1'≠W2', W3'≠W4', and W5'≠W6').

In the conventional design of the adaptive equalizer apparatus, an eye opening of the eye diagram is monitored using an eye-opening monitor to determine if the equalizer parameters should be adjusted. The signal degradation might be induced due to jitter and/or inter-symbol interference. However, the adaptive equalizer is only capable of improving the quality of a signal degraded by inter-symbol interference, and the conventional design of the adaptive equalizer apparatus does not discriminate signal degradation cause by inter-symbol interference from signal degradation caused by jitter. That is to say, the conventional eye-opening monitor has no capability of differentiating the interference sources of the transition variations R1 and R2 shown in FIG. 1 and FIG. 2. In a case where the signal degradation caused by jitter is mistakenly treated as signal degradation caused by inter-symbol interference through monitoring the eye opening of the eye diagram E1 in FIG. 1, the conventional adaptive equalizer is erroneously enabled to adjust the equalizer parameters, leading to worse signal quality of the received signal. As a result, the following signal processing (e.g., the clock and data recovery) applied to the equalizer output would fail, resulting in an unstable system.

In addition, as mentioned above, the equalizer parameters of the conventional adaptive equalizer are adaptively adjusted according to the result of monitoring the eye opening of the eye diagram, where the monitored eye diagram is an oscilloscope display of an accumulated result (i.e., an overlay) of a plurality of signal sequences rather than an instant result of a signal sequence. Furthermore, the adaptive equalizer is only capable of improving quality of a signal degraded by inter-symbol interference. That is, the conventional adaptive equalizer fails to improve quality of a signal degraded by jitter. Therefore, as the instant information of the inter-symbol interference cannot be derived from the monitored eye diagram constructed by an overlay of a plurality of signal sequences, the conventional adaptive equalizer fails to promptly tune the equalizer parameters in response to the inter-symbol interference for achieving an optimized equalizer output for following signal processing (e.g., the clock and data recovery).

SUMMARY

According to one aspect of the present invention, an adaptive equalization apparatus is provided. The adaptive equalization apparatus includes an equalizer, a monitor circuit, and a control circuit. The equalizer receives a first signal, and equalizes the first signal according to an equalization parameter setting to thereby generate a second signal. The monitor circuit is electrically connected to the equalizer, and monitors edges of the second signal in a real-time manner to thereby generate a detection result. The control logic is electrically connected to the equalizer, and adaptively adjusts the equalization parameter setting according to the detection result.

According to another aspect of the present invention, an adaptive equalization method is provided. The adaptive equalization method includes: receiving a first signal, and equalizing the first signal according to an equalization parameter setting to thereby generate a second signal; monitoring edges of the second signal in a real-time manner to thereby generate a detection result; and adaptively adjusting the equalization parameter setting according to the detection result.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

The present invention provides an adaptive equalization apparatus with an equalization parameter setting adaptively adjusted according to edges of an equalizer output monitored in a real-time manner and related method thereof. More specifically, each data width between two successive edges is measured in a real-time manner. In this way, severe inter-symbol interference can be instantly detected, and the equalization parameter setting of the equalizer can be timely adjusted to alleviate the inter-symbol interference. Further description is detailed as below.

Figure 1:
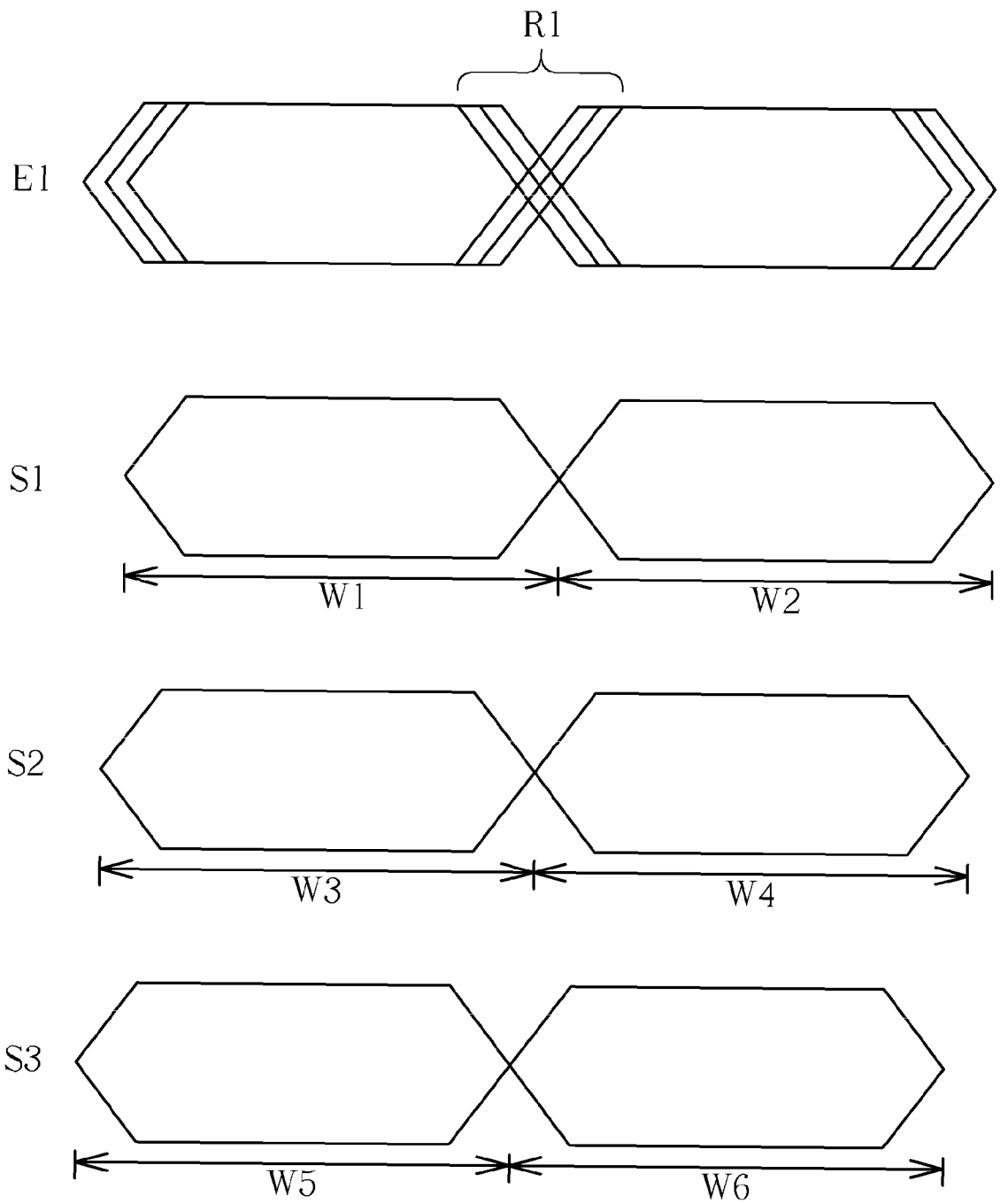
FIG. 1 illustrates an eye diagram of a received signal degraded by jitter according to the related art.
Figure 2:
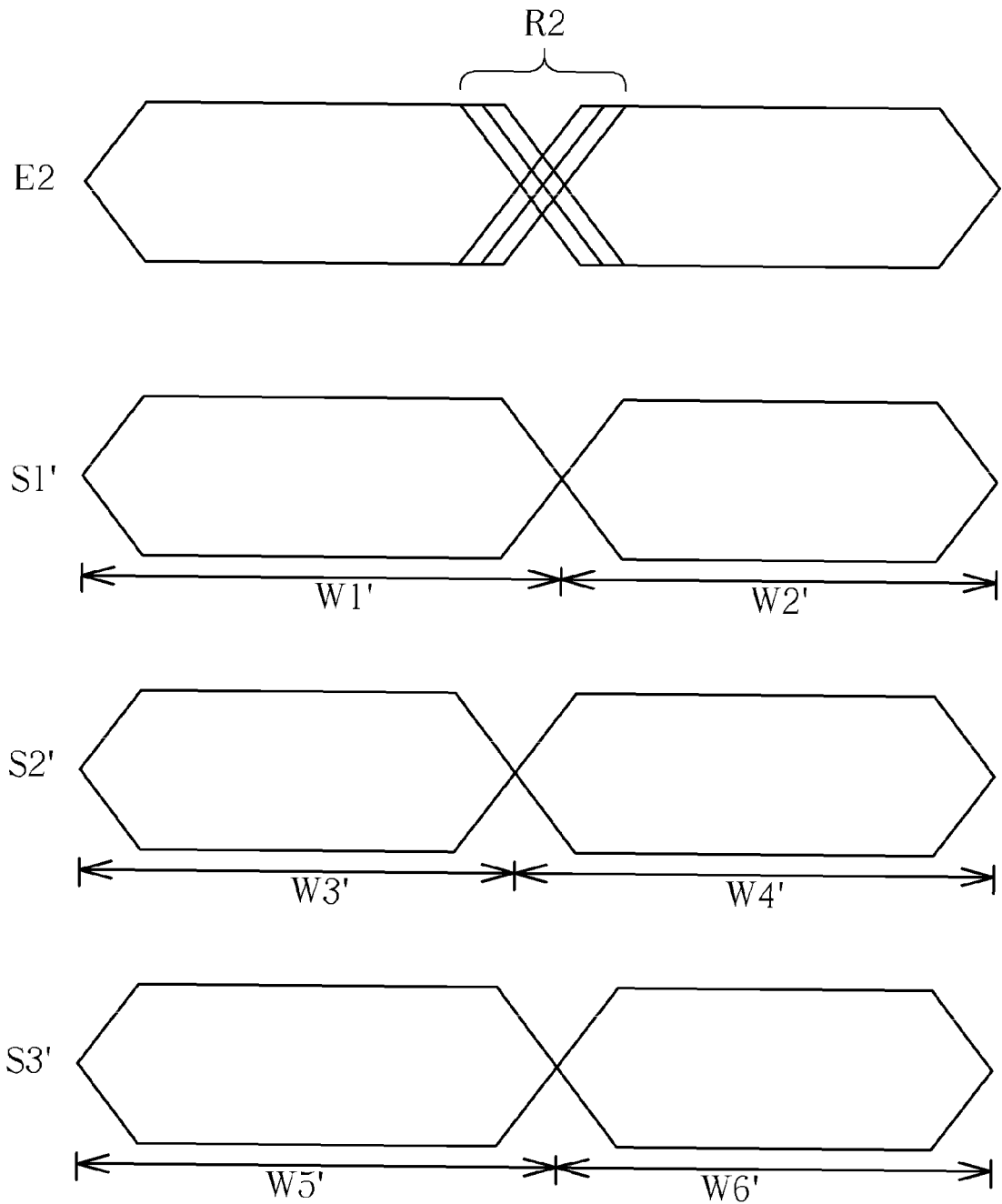
FIG. 2 illustrates an eye diagram of a received signal degraded by inter-symbol interference according to the related art.
Figure 3:
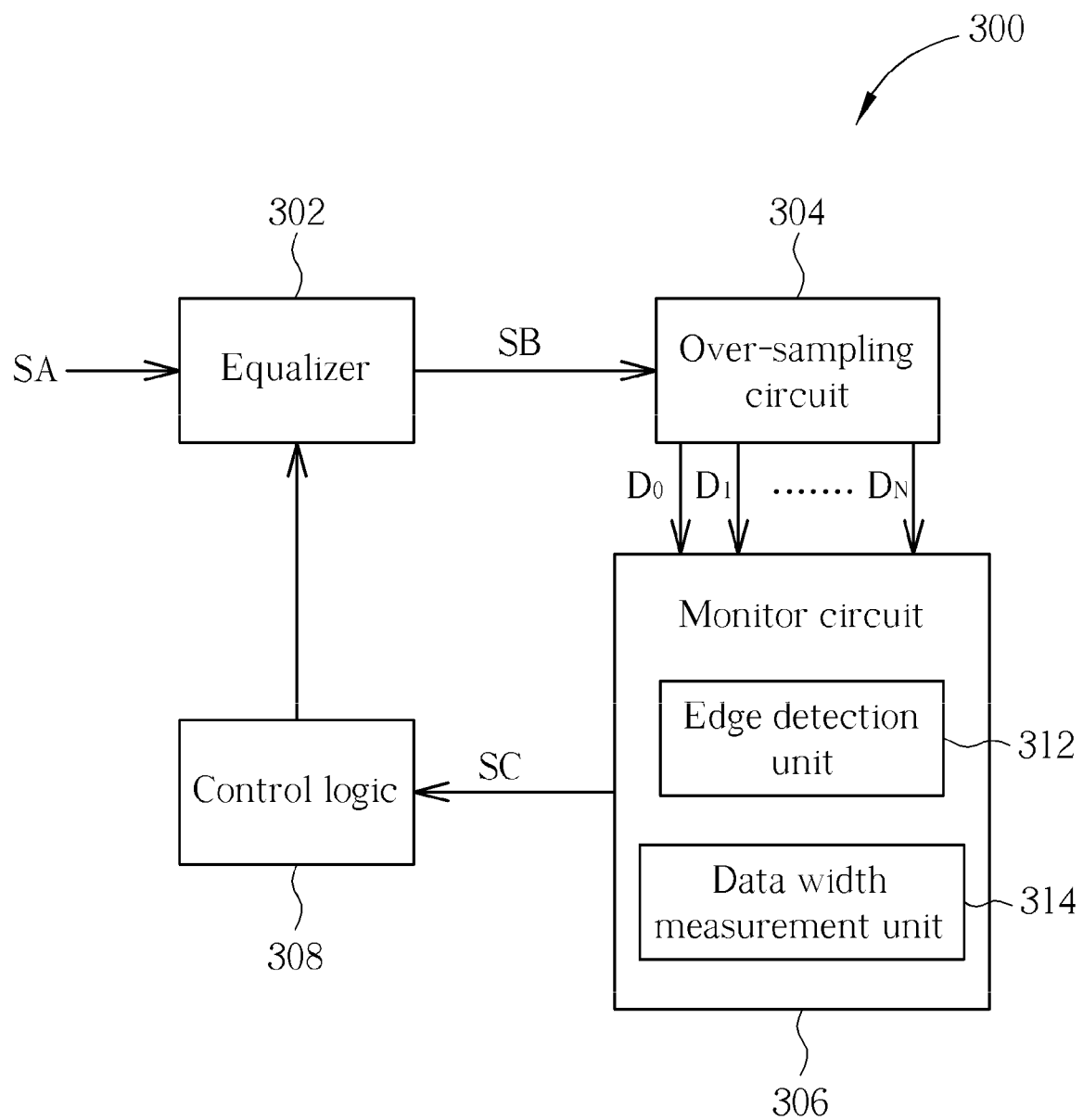
FIG. 3 is a block diagram illustrating an adaptive equalization apparatus according to an exemplary embodiment of the present invention.
Figure 4:
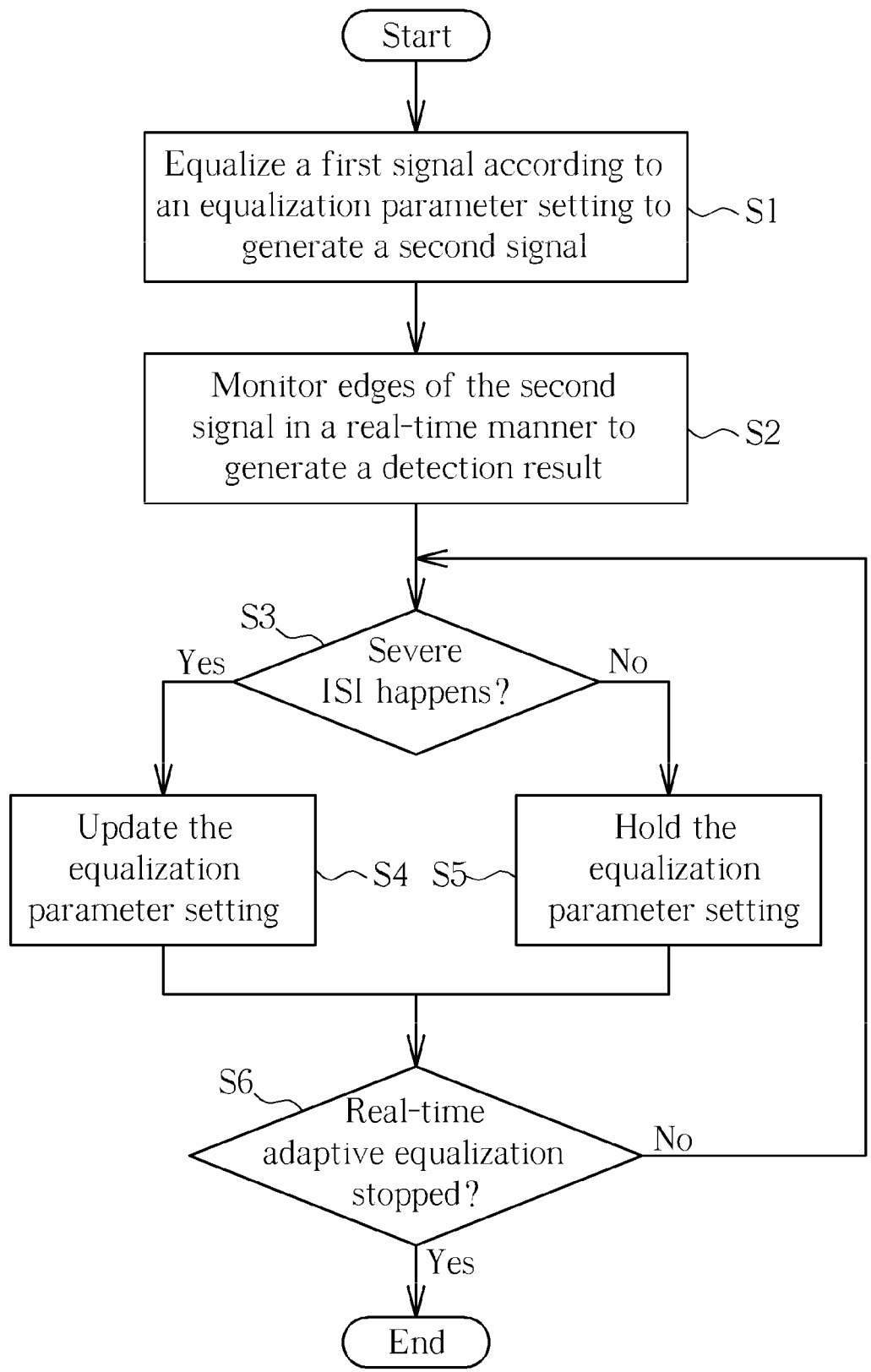
FIG. 4 is a flowchart illustrating a generalized adaptive equalization method employed by an adaptive equalization apparatus of the present invention.

Please refer to FIG. 3 in conjunction with FIG. 4. FIG. 3 is a block diagram illustrating an adaptive equalization apparatus according to an exemplary embodiment of the present invention. FIG. 4 is a flowchart illustrating a generalized adaptive equalization method employed by the adaptive equalization apparatus 300. The exemplary adaptive equalization apparatus 300 includes, but is not limited to, an equalizer 302, an over-sampling circuit 304, a monitor circuit 306, and a control logic 308. The equalizer 302 receives a first signal SA, and equalizes the first signal SA according to an equalization parameter setting to thereby generate a second signal SB (Step S1), where the equalization parameter setting could include one or more equalizer parameters (equalizer coefficients) depending upon the actual design of the equalizer 302. The over-sampling circuit 304 is electrically connected to the equalizer 302, and is implemented to serve as a converter to transform an analog-based signal into a digital-based signal. In one exemplary embodiment, the over-sampling circuit 304 over-samples the second signal SB with 5× over-sampling rate to thereby generate a plurality of data samples $D_0$-$D_N$ to the following monitor circuit 306. It should be noted that the over-sampling rate employed by the over-sampling circuit 304 is not limited to 5 times the sampling rate; that is, the over-sampling rate depends upon actual design requirements. The monitor circuit 306 is configured to refer to the data samples $D_0$-$D_N$ generated from the over-sampling circuit 304 for achieving the objective of monitoring edges of the second signal SB in a real-time manner; in addition, the monitor circuit 306 generates a detection result SC of the inter-symbol interference to the control logic 308 (Step S2). The control logic 308 is implemented for adaptively adjusting the equalization parameter setting according to the detection result SC (Steps S3, S4, S5, and S6).

In this embodiment, the monitor circuit 306 includes an edge detection unit 312 and a data width measurement unit 314. The edge detection unit 312 is configured to examine the incoming data samples $D_0$-$D_N$ for detecting edges of the second signal in a real-time manner, and the data width measurement unit 314 is configured to measure a data width between two successive edges detected by the edge detection unit 312 to generate the detection result SC (Step S2). In this embodiment, the control logic 308 is enabled to adjust the equalization parameter setting of the equalizer 302 when the detection result SC shows that a data width between successive edges is less than a predetermined threshold (Steps S3 and S4), which means that a severe ISI happens. On the contrary, the control logic 308 holds the equalization parameter setting set to the equalizer 302 when the detection result SC shows that a data width between successive edges is not less than a predetermined threshold (Steps S3 and S5). In this embodiment, the control logic 308 keeps examining the detection result SC generated from monitoring edges of the incoming second signal S2 until the real-time adaptive equalization is stopped (Step S6). For instance, in one exemplary implementation, the real-time adaptive equalization is aborted when a total number of times of adjusting the equalizer parameter setting of the equalizer 302 by the control logic 308 has reached a predetermined threshold. In another exemplary implementation, the real-time adaptive equalization is aborted when the occurrence of severe inter-symbol interference is not found for a specific duration, which implies that the equalizer parameter setting of the equalizer 302 has been adjusted to an optimized setting. In other words, the real-time adaptive equalization is aborted if a time period in which the control logic 308 keeps holding the equalizer parameter setting of the equalizer 302 without making any equalizer parameter adjustment has reached a predetermined threshold. It should be noted that above exemplary implementations are for illustrative purposes only, and are not meant to be limitations to the scope of the present invention. For example, the criterion of stopping the real-time adaptive equalization can be set according to design requirements of the adaptive equalization apparatus. These alternative designs all obey the spirit of the present invention.

The adaptive equalization apparatus 300 focuses on the data width between successive edges of the equalizer output to identify the occurrence of severe inter-symbol interference. In other words, as the equalizer 302 is only capable of improving quality of a signal degraded by inter-symbol interference, the information associated with the inter-symbol interference (e.g., the data width between edges) is therefore monitored, and the adaptive equalization apparatus 300 ignores the edge position variation which might be caused by jitter. As a result, the adjustment of the equalizer parameters is enabled upon detection of edges severely influenced due to inter-symbol interference.

As mentioned above, the edge detection unit 312 is configured to detect edges of the second signal SB in the real-time manner by examining the incoming data samples $D_0$-$D_N$. One exemplary hardware implementation of the edge detection unit 312 is to use XOR logic gates. Please refer to FIG. 5. FIG.

5 is a diagram illustrating an exemplary embodiment of the edge detection unit 312 shown in FIG. 3. The edge detection unit 312 includes a plurality of XOR logic gates each for performing an XOR operation upon every two successive data samples generated from the over-sampling circuit 304, thereby generating a plurality of logic outputs. Take the over-sampling circuit 304 with a 5× over-sampling rate as an example. When a current bit sequence of four data bits transmitted via the second signal SB are sampled using 5× over-sampling rate, 20 data samples (bits) $D_0$-$D_{19}$ are therefore generated. As shown in the exemplary embodiment of FIG. 5, the edge detection unit 312 includes 20 XOR logic gates 401-420 to generate logic outputs $L_0$-$L_{19}$, where the XOR logic gate 401 performs an XOR operation upon the last data sample $D'_{19}$ of a previous bit sequence and the first data sample $D_0$ of the current bit sequence. When two successive data samples fed into an XOR logic gate have different logic values, a logic output generated from the XOR logic gate has a logic value equal to '1'. This implies that an edge (i.e., a level transition) occurs. In this embodiment, the data width measurement unit 314 shown in FIG. 3 measures a data width between two successive edges by counting consecutive logic outputs each having a first logic value (e.g., '0') between two logic outputs each having a second logic value (e.g., '1'), thereby generating the detection result SC to the control logic 308. When the counter value of the consecutive 0's between two 1's is less than a predetermined threshold (e.g., 3 or 4), the control logic 308 judges that severe inter-symbol interference occurs, and then adjusts the equalization parameter setting of the equalizer 302 to alleviate the inter-symbol interference. For clear understanding of the operation of adaptively adjusting the equalization parameter setting of the equalizer 302, certain examples are illustrated as follows.

Figure 6:
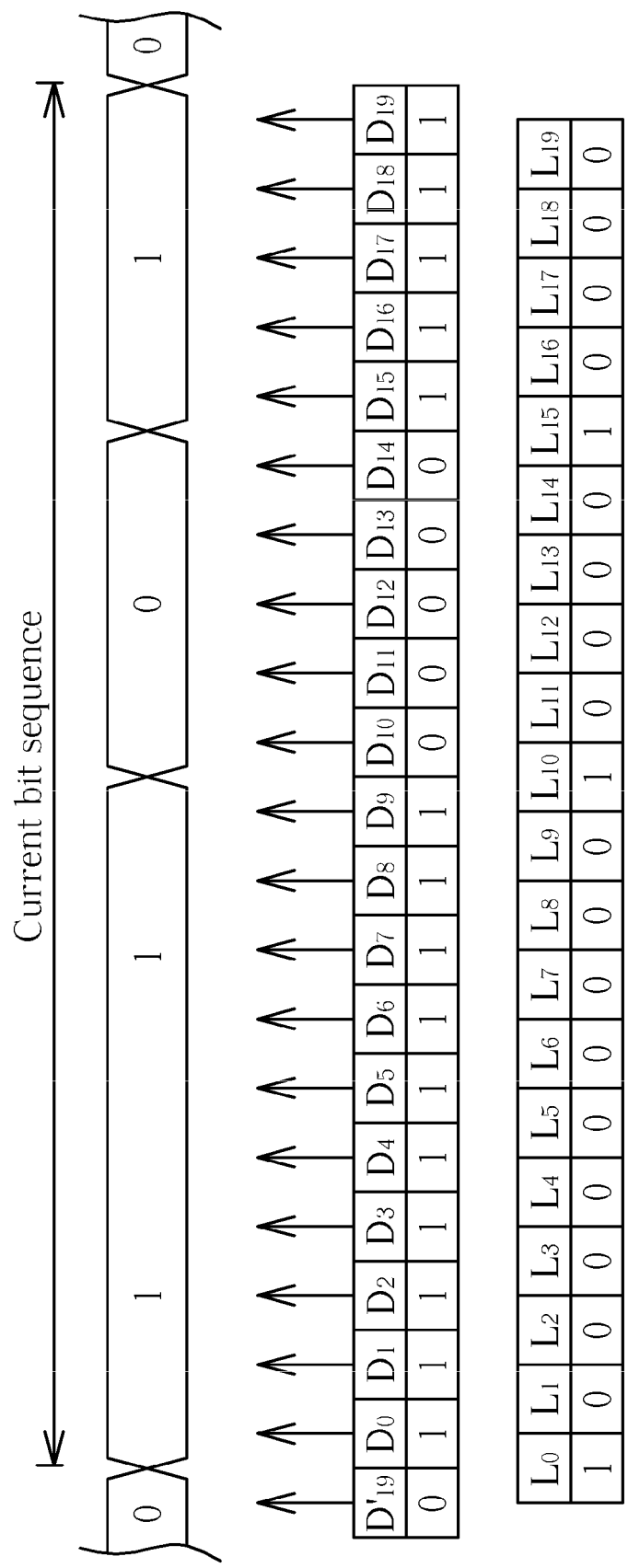
FIG. 6 is a diagram illustrating data width measurement applied to an equalizer output without inter-symbol interference.

Please refer to FIG. 6, which is a diagram illustrating data width measurement applied to an equalizer output without inter-symbol interference. The over-sampling circuit 304 uses 5× over-sampling rate to sample a current bit sequence having 4 data bits '1101' to produce 20 data samples '11111111110000011111'. It should be noted that in this example the last data sample $D'_{19}$ of a previous bit sequence is '0'. The XOR logic gates 401-420 therefore generate 20 logic outputs '10000000001000010000'. Next, the data width measurement unit 314 measures a data width between two successive edges by counting consecutive 0's between two 1's. As one can see, the data width between two successive edges corresponds to a counter value of 0's equal to 9 or 4 in this exemplary embodiment. Therefore, as the number of consecutive 0's between two 1's is not less than the predetermined threshold (e.g., 3 or 4), the inter-symbol interference monitor result of the current bit sequence with 4 data bits '1101' will not trigger the control logic 308 to adjust the equalization parameter setting of the equalizer 302.

Figure 7:
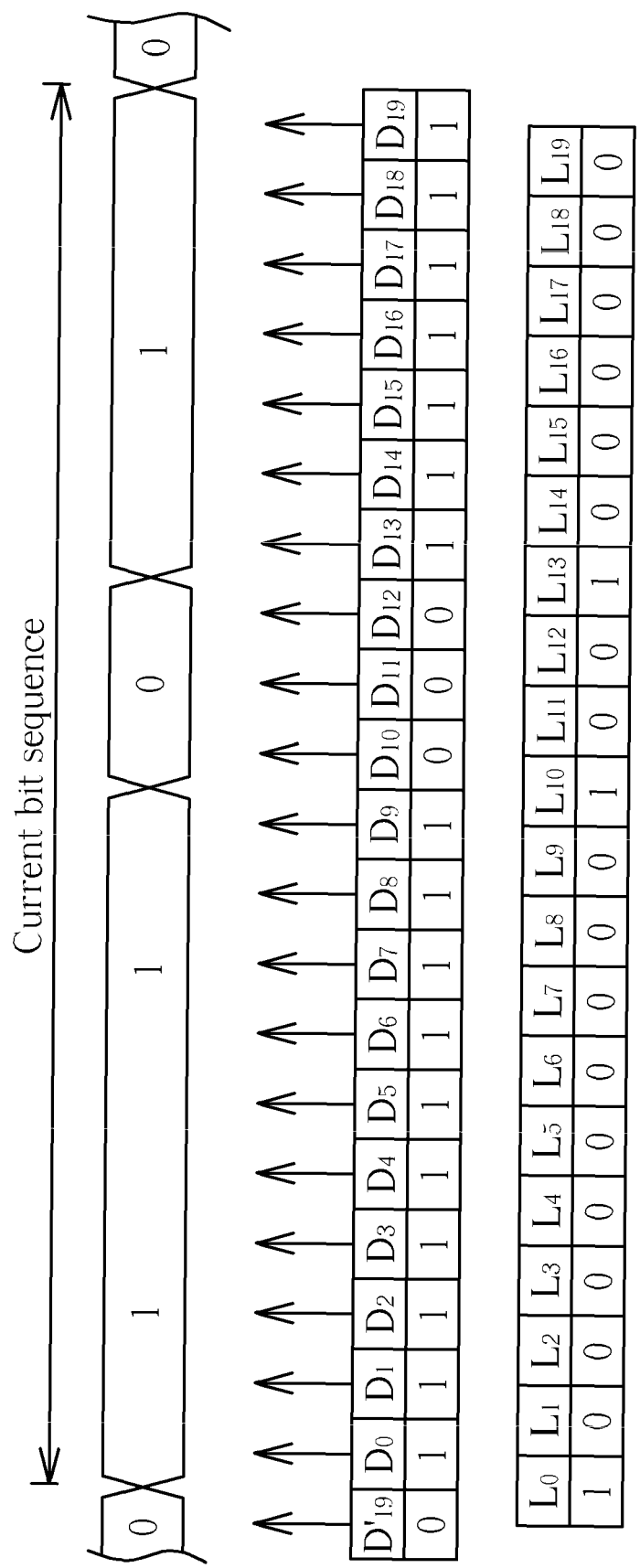
FIG. 7 is a diagram illustrating data width measurement applied to an equalizer output with inter-symbol interference.

Please refer to FIG. 7, which is a diagram illustrating data width measurement applied to an equalizer output with inter-symbol interference. Compared with the data bits '1101' shown in FIG. 6, the data bits '1101' shown in FIG. 7 have '0' with a narrower data width and the following '1' with a wider data width due to the undesired inter-symbol interference induced, for example, by the limited channel bandwidth of a transmission cable. The over-sampling circuit 304 uses 5× over-sampling rate to sample a current bit sequence having 4 data bits '1101' to produce 20 data samples '11111111110001111111'. It should be noted that in this example the last data sample $D'_{19}$ of a previous bit sequence is '0'. The XOR logic gates 401-420 therefore generate 20 logic outputs '10000000001001000000'. Next, the data width measurement unit 314 measures a data width between two successive edges by counting consecutive 0's between two 1's. As one can see, one data width between two successive edges corresponds to a counter value of 0's equal to 9, which is not less than the predetermined threshold (e.g., 3 or 4); however, the other data width between two successive edges corresponds to a counter value of 0's equal to 2, which is less than the predetermined threshold (e.g., 3 or 4). As the number of consecutive 0's between two 1's is found less than the predetermined threshold, the inter-symbol interference monitor result of the current bit sequence with 4 data bits '1101' will trigger the control logic 308 to adjust the equalization parameter setting of the equalizer 302 upon detection of such an unacceptable data width.

Figure 5:
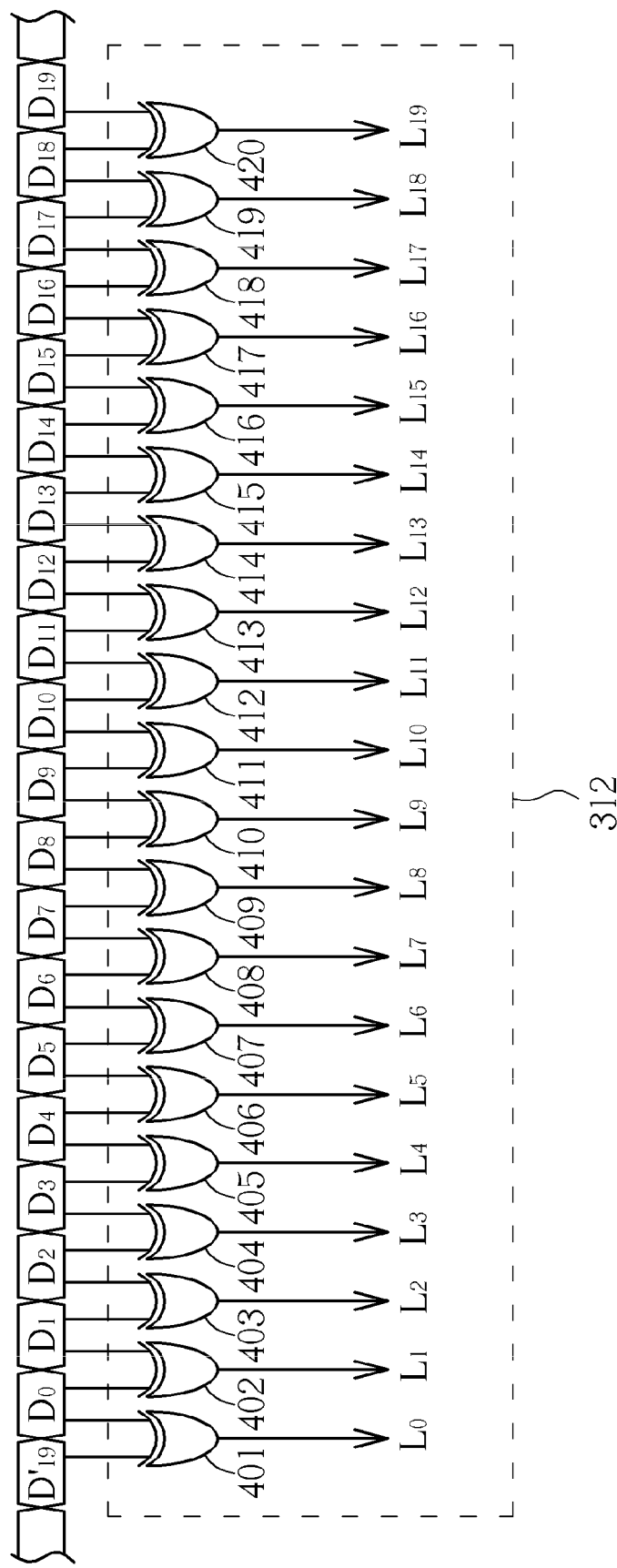
FIG. 5 is a diagram illustrating an exemplary embodiment of an edge detection unit shown in FIG. 3.

Please note that the number of the XOR logic gates shown in FIG. 5 is for illustrative purposes only, and is not meant to be a limitation of the present invention. For example, the number of the XOR logic gates implemented in the edge detection unit 312 depends on the over-sampling architecture employed by the over-sampling circuit 304.

Figure 8:
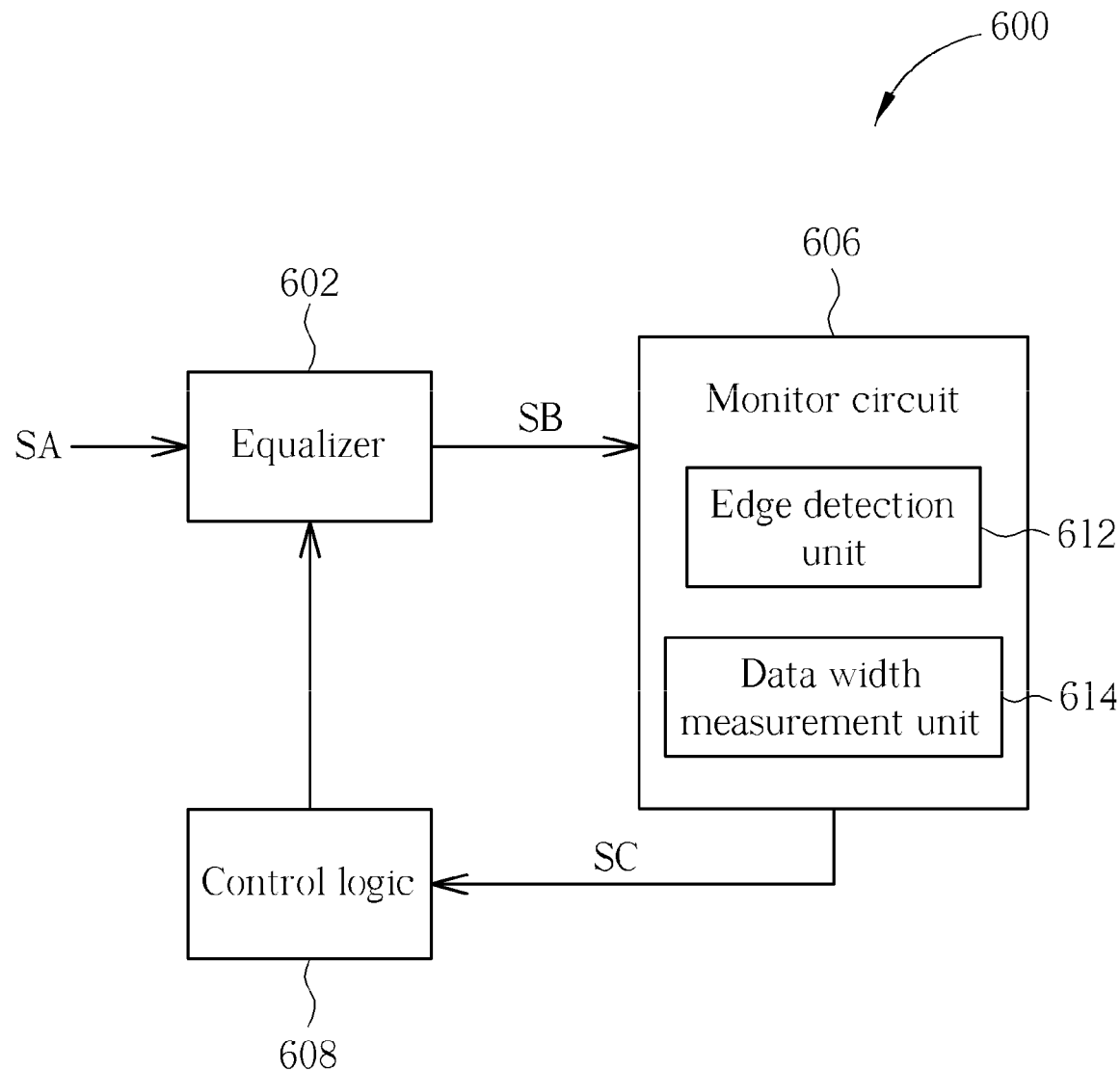
FIG. 8 is a block diagram illustrating an adaptive equalization apparatus according to another exemplary embodiment of the present invention.

In the aforementioned embodiment of the adaptive equalization apparatus 300, the over-sampling circuit 304 is included to convert an analog-based signal into a digital-based signal for following digital-domain edge detection and data width measurement. However, the present invention is not limited to such an implementation disclosed above. In other words, the over-sampling circuit 304 could be optional in other exemplary embodiments of the present invention. Please refer to FIG. 8. FIG. 8 is a block diagram illustrating an adaptive equalization apparatus according to another exemplary embodiment of the present invention. In this alternative design, the adaptive equalization apparatus 600 includes, but is not limited to, an equalizer 602, a monitor circuit 606, and a control logic 608, where the monitor circuit 606 includes an edge detection unit 612 and a data width measurement unit 614. By way of example, the adaptive equalization apparatus 600 also employs the generalized adaptive equalization method shown in FIG. 4 for adaptively adjusting the equalizer parameters. The equalizer 602 is for receiving a first signal SA and for equalizing the first signal SA according to an equalization parameter setting to thereby generate a second signal SB (Step S1 in FIG. 4). The monitor circuit 606 is for monitoring edges of the second signal in a real-time manner to thereby generate a detection result SC (Step S2 in FIG. 4). For example, the edge detection unit 612 detects edges of the second signal SB in a real-time manner, and then the data width measurement unit 614 measures a data width between two successive edges detected by the edge detection unit 612 to thereby generate the detection result SC to the control logic 308. Next, the control logic 608 adaptively adjusts the equalization parameter setting of the equalizer 602 according to the detection result SC (Steps S3, S4, S5, and S6 in FIG. 4). Briefly summarized, any adaptive equalizer apparatus using an instant monitor result of a data width between two successive edges of the equalizer output to adaptively adjust the equalization parameter setting obeys the spirit of the present invention and falls within the scope of the present invention.

The adaptive equalization apparatuses 300 and 600 can be applied to a variety of applications. For example, any application requiring an adaptive equalizer to improve quality of a signal degraded by inter-symbol interference can adopt the hardware configuration shown in FIG. 3 or FIG. 8. Taking a serial transmission application for example, a cable is commonly used to transmit serial data from a transmitter end to a receiver end. In general, the cable has a limited channel bandwidth. Therefore, the inter-symbol interference would occur to degrade the signal quality of the serial data transmitted via the cable. As known to those skilled in the art, the transmitter end generally uses a parallel-to-serial converter (e.g., a multiplexer) to convert parallel data of a plurality of parallel channels into serial data to be transmitted to a receiver end via an interconnection cable. The receiver end therefore requires a serial-to-parallel converter (e.g., a demultiplexer) to recover the parallel data from the received serial data. In one implementation, a demultiplexer is disposed after the equalizer 302/602 to perform a serial-to-parallel conversion upon the equalizer output. In such a serial transmission application, the monitor circuit 306/606 is modified to monitor the inter-symbol interference of different parallel channels respectively. For example, the monitor circuit includes a plurality of monitor sets each having an edge detection unit and a data width measurement unit to monitor inter-symbol interference in one of the parallel channels. It should be noted that above example is for illustrative purposes only, and is not intended to limit the application field of the present invention.

As a person skilled in the art would readily appreciate detailed operations of each step mentioned above, further description is omitted here for the sake of brevity. Please note that any application employing above-mentioned steps to adaptively adjust the equalizer parameters obeys the spirit of the present invention and falls within the scope of the present invention.

In contrast to the conventional design of using an eye-opening monitor to monitor an eye diagram for determine if the equalizer parameters should be adjusted, the apparatus and method of the present invention derive information of the inter-symbol interference through monitoring the data width between successive edges in a real-time manner, and then uses instantaneous information associated with the inter-symbol interference to adaptively adjust the equalizer parameters. In other words, as an eye diagram constructed by an overlay of a plurality of signal sequences is unable to reflect the actual condition of the inter-symbol interference, the adjustment of the equalizer parameters in the present invention relies on the real-time data width measurement instead of the monitor result of the eye diagram. In addition, the adaptive equalizer is only capable of improve quality of a signal degraded by inter-symbol interference. Therefore, the signal quality of the equalizer output might be worsened when the equalizer parameters are improperly adjusted due to detection of transitions (edges) influenced by jitter. To avoid such a signal degradation resulted from the improper equalizer adjustment, the adjustment of the equalizer parameters is only enabled upon detection of edges severely influenced by inter-symbol interference.

Those skilled in the art will readily observe that numerous modifications and alterations of the device and method may be made while retaining the teachings of the invention.

What is claimed is:

1. An adaptive equalization apparatus, comprising:
    an equalizer, for receiving a first signal and for equalizing the first signal according to an equalization parameter setting to thereby generate a second signal;
    a monitor circuit, electrically connected to the equalizer, for monitoring edges of the second signal in a real-time manner to thereby generate a detection result, wherein the monitor circuit comprises:
        an edge detection unit, for detecting the edges of the second signal in the real-time manner; and
        a data width measurement unit, electrically connected to the edge detection unit, for measuring a data width between two successive edges detected by the edge detection unit, thereby generating the detection result; and
    a control logic, electrically connected to the equalizer, for adaptively adjusting the equalization parameter setting according to the detection result.

2. The adaptive equalization apparatus of claim 1, wherein the control logic is enabled to adjust the equalization parameter setting when the detection result shows that the data width is less than a predetermined threshold.

3. The adaptive equalization apparatus of claim 1, further comprising:
    an over-sampling circuit, electrically connected between the equalizer and the monitor circuit, for over-sampling the second signal to generate a plurality of data samples;
    wherein the monitor circuit generates the detection result according to the data samples.

4. The adaptive equalization apparatus of claim 3, wherein the edge detection unit comprises:
    a plurality of XOR logic gates each for performing an XOR operation upon every two successive data samples of the data samples generated from the over-sampling circuit, thereby generating a plurality of logic outputs; and
the data width measurement unit is arranged for measuring the data width between two successive edges by counting consecutive logic outputs each having a first logic value between two logic outputs each having a second logic value different from the first logic value, thereby generating the detection result.

5. An adaptive equalization method, comprising:
receiving a first signal and equalizing the first signal according to an equalization parameter setting to thereby generate a second signal;
monitoring edges of the second signal in a real-time manner to thereby generate a detection result; and
adaptively adjusting the equalization parameter setting according to the detection result;
wherein the step of monitoring the edges of the second signal in the real-time manner to thereby generate the detection result comprises:
detecting the edges of the second signal in the real-time manner; and
measuring a data width between two successive detected edges to thereby generate the detection result.

6. The adaptive equalization method of claim 5, wherein the step of adaptively adjusting the equalization parameter setting comprises:
when the detection result shows that the data width is less than a predetermined threshold, adjusting the equalization parameter setting.

7. The adaptive equalization method of claim 5, further comprising:
over-sampling the second signal to generate a plurality of data samples;
wherein the detection result is generated according to the data samples.

8. The adaptive equalization method of claim 7, wherein the step of detecting the edges of the second signal in the real-time manner comprises:
performing an XOR operation upon every two successive data samples of the data samples, thereby generating a plurality of logic outputs; and
the step of measuring the data width between two successive detected edges to thereby generate the detection result comprises:
measuring the data width between two successive edges by counting consecutive logic outputs each having a first logic value between two logic outputs each having a second logic value different from the first logic value, thereby generating the detection result.

9. An adaptive equalization apparatus, comprising:
an equalizer, for receiving a first signal and for equalizing the first signal according to an equalization parameter setting to thereby generate a second signal;
an over-sampling circuit, for over-sampling the second signal to generate a plurality of data samples;
a monitor circuit, for monitoring edges of the second signal in a real-time manner to thereby generate a detection result, wherein the over-sampling circuit is electrically connected between the equalizer and the monitor circuit, the monitor circuit generates the detection result according to the data samples, and the monitor circuit comprises:
   an edge detection unit, comprising:
      a plurality of XOR logic gates each for performing an XOR operation upon every two successive data samples of the data samples generated from the over-sampling circuit, thereby generating a plurality of logic outputs; and
   a data width measurement unit, electrically connected to the edge detection unit, for measuring a data width between two successive edges by counting consecutive logic outputs each having a first logic value between two logic outputs each having a second logic value different from the first logic value, thereby generating the detection result; and a control logic, electrically connected to the equalizer, for adaptively adjusting the equalization parameter setting according to the detection result.

10. An adaptive equalization method, comprising:
receiving a first signal and equalizing the first signal according to an equalization parameter setting to thereby generate a second signal;
over-sampling the second signal to generate a plurality of data samples;
monitoring edges of the second signal in a real-time manner to thereby generate a detection result, wherein the detection result is generated according to the data samples, and the step of monitoring the edges of the second signal in the real-time manner to thereby generate the detection result comprises:
   performing an XOR operation upon every two successive data samples of the data samples, thereby generating a plurality of logic outputs; and
   measuring a data width between two successive edges by counting consecutive logic outputs each having a first logic value between two logic outputs each having a second logic value different from the first logic value, thereby generating the detection result; and
adaptively adjusting the equalization parameter setting according to the detection result.

* * * * *